(12) United States Patent
Choi et al.

(10) Patent No.: US 11,152,067 B2
(45) Date of Patent: Oct. 19, 2021

(54) CONTENT ADDRESSABLE MEMORY WITH SPIN-ORBIT TORQUE DEVICES

(71) Applicant: SanDisk Technologies LLC, Addison, TX (US)

(72) Inventors: Won Ho Choi, San Jose, CA (US); Jongyeon Kim, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/253,980

(22) Filed: Jan. 22, 2019

(65) Prior Publication Data

US 2020/0075099 A1  Mar. 5, 2020

Related U.S. Application Data

(60) Provisional application No. 62/725,088, filed on Aug. 30, 2018.

(51) Int. Cl.
| | |
|---|---|
| *G11C 15/02* | (2006.01) |
| *G11C 7/10* | (2006.01) |
| *H01L 43/06* | (2006.01) |
| *H01L 43/10* | (2006.01) |
| *H01L 27/22* | (2006.01) |

(52) U.S. Cl.
CPC ............ *G11C 15/02* (2013.01); *G11C 7/1096* (2013.01); *H01L 27/226* (2013.01); *H01L 43/065* (2013.01); *H01L 43/10* (2013.01)

(58) Field of Classification Search
CPC .................................................... G11C 15/02
USPC .......................................................... 365/50
See application file for complete search history.

(56) References Cited

U.S. PATENT DOCUMENTS

| | | | |
|---|---|---|---|
| 9,728,259 B1* | 8/2017 | Jung | G11C 15/02 |
| 2010/0188891 A1* | 7/2010 | Taniguchi | G11C 14/0081 |
| | | | 365/158 |

(Continued)

OTHER PUBLICATIONS

Matsunaga, et al., "A 3.14 urn 2 4T-2MTJ-cell fully parallel TCAM based on nonvolatile logic-in-memory architecture," n 2012 Symposium on VLSI Circuits, VLSIC 2012 (pp. 44-45). [6243781] (IEEE Symposium on VLSI Circuits, Digest )f Technical Papers) (2012).*

(Continued)

*Primary Examiner* — Muna A Techane
(74) *Attorney, Agent, or Firm* — Volpe Koenig

(57) ABSTRACT

Ternary content addressable memory (TCAM) circuits are provided herein. In one example implementation, a TCAM circuit can include a first spin-orbit torque (SOT) magnetic tunnel junction (MTJ) element having a pinned layer coupled to a first read transistor controlled by a first search line, and having a spin hall effect (SHE) layer coupled in a first configuration across complemented write inputs. The TCAM circuit can include a second SOT MTJ element having a pinned layer coupled to a second read transistor controlled by a second search line, and having a SHE layer coupled in a second configuration across the complemented write inputs. The TCAM circuit can include a bias transistor configured to provide a bias voltage to drain terminals of the first read transistor and the second read transistor, and a voltage keeper element that couples the drain terminals to a match indicator line.

9 Claims, 9 Drawing Sheets

(56) References Cited

U.S. PATENT DOCUMENTS

2015/0235703 A1* 8/2015 Sakimura ............ G11C 11/1675
365/49.17
2016/0064650 A1* 3/2016 Wang .................... H01L 27/228
257/427
2018/0340978 A1* 11/2018 Yabuuchi ................ G06F 11/27

OTHER PUBLICATIONS

Liu et al., "Spin-torque switching with the giant spin Hall effect of tantalum." Science (New York, N.Y.) vol. 336, 6081 2012).*
Kim et al., "Spin-Hall effect MRAM based cache memory: A feasibility study," 2015 73rd Annual Device Research Conference (DRC), pp. 117-118, (2015).*
Sengupta et al., "Proposal for an All-Spin Artificial Neural Network: Emulating Neural and Synaptic Functionalities Through Domain Wall Motion in Ferromagnets," in IEEE Transactions on Biomedical Circuits and Systems, vol. 10, No. 3, pp. 1152-1160, (Dec. 2016).*
Imani, et al., "Low-Power Sparse Hyperdimensional Encoder for Language Recognition," in IEEE Design & Test, vol. 34, No. 6, pp. 94-101, (Dec. 2017.*
Pagiamtzis et al., "Content-addressable memory (CAM) circuits and architectures: A tutorial and survey," IEEE Journal of Solid-State Circuits, vol. 41, No. 3 (Mar. 3, 2006).*
Matsunaga, et al., "A 3.14 um 2 4T-2MTJ-cell fully parallel TCAM based on nonvolatile logic-in-memory architecture," n 2012 Symposium on VLSI Circuits, VLSIC 2012 (pp. 44-45). [6243781] (IEEE Symposium on VLSI Circuits, Digest of Technical Papers) (2012).
Sengupta et al., "Proposal for an All-Spin Artificial Neural Network: Emulating Neural and Synaptic Functionalities Through Domain Wall Motion in Ferromagnets," in IEEE Transactions on Biomedical Circuits and Systems, vol. 10, No. 6, pp. 1152-1160, (Dec. 2016).

* cited by examiner

| STORED DATA | | | SL | ML |
| --- | --- | --- | --- | --- |
| TOTAL CELL VALUE | MTJ 542 | MTJ 543 | | |
| 0 | 0 (high MTJ value, anti-parallel state) | 1 (low MTJ value, parallel state) | 0 | H (matched) |
| | | | 1 | L (unmatched) |
| 1 | 1 | 0 | 0 | L (unmatched) |
| | | | 1 | H (matched) |
| X | 0 | 0 | 0 | H |
| | | | 1 | H |

CONTENT ADDRESSABLE MEMORY WITH SPIN-ORBIT TORQUE DEVICES

RELATED APPLICATIONS

This application hereby claims the benefit of and priority to U.S. Provisional Patent Application 62/725,088, titled "SPIN-ORBIT TORQUE DEVICE BASED CONTENT ADDRESSABLE MEMORY," filed Aug. 30, 2018, which is hereby incorporated by reference in its entirety.

TECHNICAL FIELD

Aspects of the disclosure are related to the fields of content addressable memory and artificial neural networks.

BACKGROUND

Content-addressable memories (CAMs) are a data storage arrangement which allows quick searching among stored data using input values. Random-access memory (RAM) uses an input storage address to retrieve data at specific addresses. In contrast, CAMs accept input data or input tags to determine if input data is held within the CAM, and if found, generate a storage address or addresses corresponding to matching input data within the CAM. When employed in an arrangement called an associative memory, the storage address or addresses determined by the CAM can subsequently be input to a random-access memory to produce an output value based on those storage addresses. Another form of CAM is called a ternary content-addressable memory (TCAM) which allows for wildcard, "don't care," or undefined portions of the input data. This TCAM arrangement can be helpful when not all digits of input data are known, and can generate a list of addresses from a CAM which match the input data pattern having wildcard values. However, TCAM implementations require encoding of at least three states for each bit instead of two for more traditional CAMs, referred to as binary CAMs.

Various TCAM implementations have been attempted, but these implementations suffer from large power consumption, high semiconductor footprints, and limited speed. For example, complementary metal-oxide semiconductor (CMOS) based CAMs can be have a large static power dissipation and large area overhead as the density of CMOS-based CAMs increase. Another TCAM implementation employs spin-transfer torque (STT) magnetic random-access memory (MRAM) cells. However, these arrangements have limited search speeds due in part to low tunnel magnetoresistance (TMR) properties of the STT MRAM configuration. Moreover, high write currents needed for STT MRAM-based TCAMs lead to undesirable power dissipations and larger feature sizes for read/write support circuitry.

CAMs and TCAMs are often employed in network routing equipment. However, these memory structures can also be employed in artificial neural networks (ANN). ANNs can be formed from individual artificial neurons that are emulated using software, integrated hardware, or other discrete elements. Neuromorphic computing can employ ANNs, which focuses on using electronic components such as analog/digital circuits in integrated systems to mimic the human brain, and to attempt a greater understanding of the neuro-biological architecture of the neural system. Neuromorphic computing emphasizes implementing models of neural systems to understand how the morphology of individual neurons, synapses, circuits, and architectures lead to desirable computations.

OVERVIEW

Ternary content addressable memory (TCAM) circuits are provided herein. In one example implementation, a TCAM circuit can include a first spin-orbit torque (SOT) magnetic tunnel junction (MTJ) element having a pinned layer coupled to a first read transistor controlled by a first search line, and having a spin hall effect (SHE) layer coupled in a first configuration across complemented write inputs. The TCAM circuit can include a second SOT MTJ element having a pinned layer coupled to a second read transistor controlled by a second search line, and having a SHE layer coupled in a second configuration across the complemented write inputs. The TCAM circuit can include a bias transistor configured to provide a bias voltage to drain terminals of the first read transistor and the second read transistor, and a voltage keeper element that couples the drain terminals to a match indicator line.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

FIG. 6 illustrates example operations of a content addressable memory with spin orbit torque devices in an implementation.

DETAILED DESCRIPTION

Figure 1:
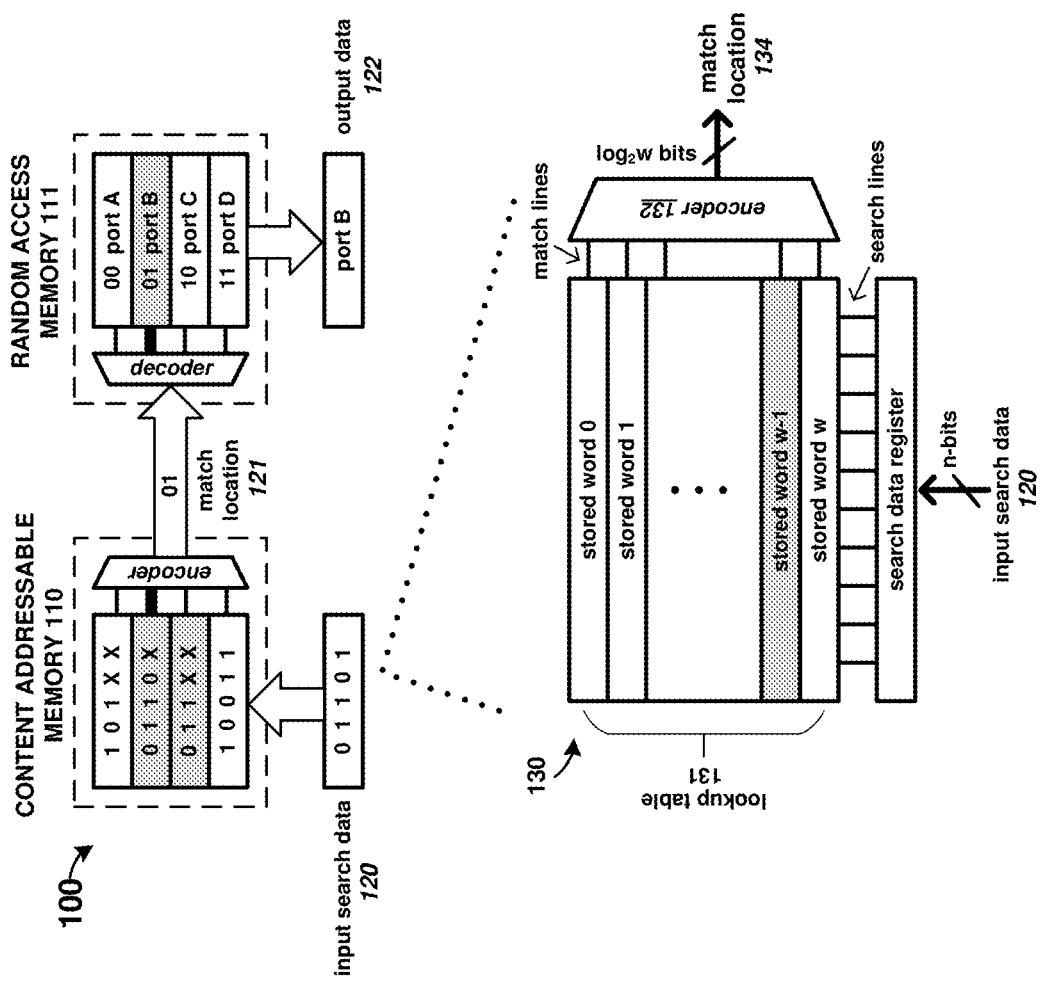
FIG. 1 illustrates content addressable memories in an implementation.

In the discussion herein, various enhanced circuits are presented. These enhanced circuits can include content addressable memory (CAM) elements to further accelerate operation and reduce power consumption of neural networks, among other applications. For example, the CAM structures can be employed in any content addressable memory and any content addressable memory application. Ternary content addressable memory (TCAM) structures are discussed herein which allow for wildcard, "don't care," or undefined portions of input data to generate matching results. One such TCAM structure discussed herein comprises two Spin Hall Effect (SHE) magnetoresistive random-access memory (MRAM) cells which employ spin orbit torque (SOT) magnetic tunnel junction (MTJ) elements.

CAM and TCAM structures typically employ non-volatile memory (NVM) elements to store data which can be searched using input data or input tags. Past attempts at CAM/TCAM structures include complementary metal-oxide-silicon (CMOS) structures used to implement static random-access memory (SRAM) memory elements. Although functional for CAM/TCAM purposes, CMOS-based cells are large and consume more power than other cell types. Thus, CMOS-based cells are not desirable for use in neural network TCAM structures, such as those discussed below in FIG. 2.

CAM/TCAM structures might instead be formed using magnetic tunnel junctions (MTJs), or various resistive memory devices, such as memristors. MTJ elements can be used to form data storage elements. MTJs operate using tunnel magnetoresistance (TMR), which is a magneto-resistive effect. MTJs typically consist of two layers of ferromagnetic materials separated by a thin insulator layer through which electrons can quantum-mechanically tunnel from one ferromagnetic layer into the other. One ferromagnetic layer of an MTJ can be referred to as a pinned layer which has a fixed magnetization state, while another ferromagnetic layer of an MTJ comprises a free layer which can change in magnetization state. An intermediate layer comprising a thin insulator separating the two ferromagnetic layers can be formed from an oxide material or other suitable electrical insulator. Electrical terminals can be formed to interface the free and pinned layers of the MTJ to other components in a circuit.

MTJ elements can typically be placed into two different states, which can correspond to different logical values stored therein. These states depend upon a magnetization state of the MTJ element, which corresponds to a magneto-resistive value presently exhibited by the MTJ element. The alterable magnetization states of MTJ elements discussed herein can change among two states, namely a parallel state and an anti-parallel state. A parallel state occurs when a free layer and pinned layer of an MTJ element are in the same magnetization state. An anti-parallel state occurs when a free layer and pinned layer of an MTJ element are in a different magnetization state. Logical values can be assigned to the magnetization states, such as logical '0' for the anti-parallel state and logical '1' for the parallel state, among other configurations.

MTJ types can include various configurations that can be employed in artificial neural network circuitry and CAM/TCAM circuitry. MTJ devices typically employ spin polarized currents to reversibly switch a magnetization state of a ferromagnetic layer, namely a magnetization state of the free layer mentioned above. Perpendicular or parallel arrangements of MTJ elements can be employed, which refer to a type of magnetic anisotropy associated with a preferred direction of alignment in magnetic moments within the MTJ element with respect to a surface of a corresponding semiconductor substrate. A first type of MTJ configuration includes a homogeneous perpendicular spin-transfer torque (STT) arrangement, which typically comprises a 2-terminal device formed from at least three stacked layers of material. These three layers include a tunnel barrier layer disposed between a pinned layer and a free layer. The free layer and the pinned layer are coupled to the two terminals of the STT MTJ.

STT MTJ based TCAM cells have been developed which can be comprised of several control transistors and two STT MTJ elements. This structure has advantages over the CMOS configuration above in that little to no static power consumption occurs, comprises a more compact size, and has a reduced transistor count. Also, configurations of STT MTJ based TCAMs might use shared or separate write lines (WL) and read/search lines (SL). Separated write and search lines can have structural advantages over the CMOS designs. However, search speed (read speed) is limited in STT MTJ based circuits due in part to the low tunnel magnetoresistance (TMR) properties of the STT MTJ elements, and higher relative write current inherent in the STT configurations. Thus, to increase TCAM search speeds, larger sized STT MTJs must be employed. Also, due to the circuit configuration, read disturbances can be encountered.

Due to the limitations and performance concerns of both CMOS and STT MTJ based TCAM designs, an enhanced MTJ-based design is now presented. One such MTJ-based design discussed herein comprises two Spin Hall Effect (SHE) magnetoresistive random-access memory (MRAM) cells which employ heterogeneous in-plane spin orbit torque (SOT) magnetic tunnel junction (MTJ) elements. This enhanced design can be employed in any CAM or TCAM, which may or may not be employed in neural network applications. Therefore, general purpose content-addressable memory structures can be provided with these enhanced cell circuit structures.

SOT MTJ devices typically comprise 3-terminal devices. In contrast to the two-terminal STT MTJ devices, SOT MTJ devices can have an additional metal underlayer terminal, among other differences. In these SOT MTJ configurations, separate "write" and "read" current paths are provided which can allow longer device lifetimes. In SOT MTJ devices, a write current transits through a separate underlying layer instead of through a tunnel barrier layer, as occurs in STT MTJ elements. The write current through the tunnel barrier layer in STT MTJ elements can lead to more wear and damage to tunnel barrier layer materials, as compared to SOT MTJ elements. Also, when separate write and read paths are employed, read control elements and write control elements, such as read or write control transistors, can have a smaller relative size compared to STT MTJ structures. This is due in part to a larger tunnel magnetoresistance (TMR) of the SOT MTJ configuration compared to STT MTJ structures. Specifically, SOT MTJ devices can employ higher TMR than STT MTJ devices, which can reduce the write and read energy needed for CAM/TCAM structures discussed herein. The reduced energy needed corresponds to less read/write current required in the SOT MTJ configuration as compared to other MRAM or CMOS structures, which can lead to longer device durations.

Figure 4:
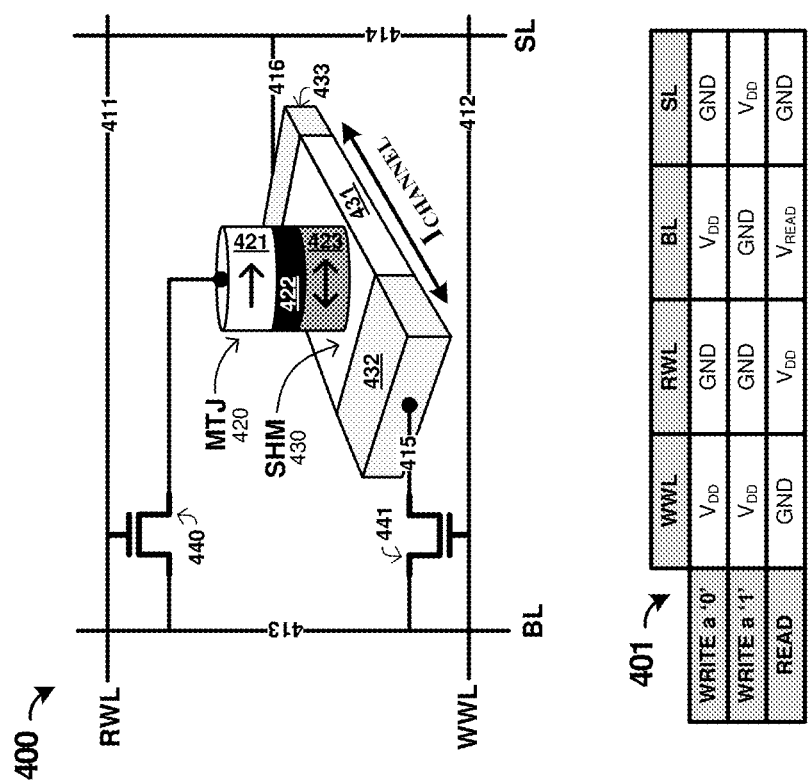
FIG. 4 illustrates an example circuit with a spin orbit torque device in an implementation.

SOT MTJs can also be referred to herein as Spin-Hall Effect (SHE) MTJs, where the metal underlayer comprises a spin hall metal (SHM). Example SHE MTJ structures are shown in FIG. 4 below. Other approaches can replace an SOT in-plane MTJ with an SOT perpendicular MTJ that has an external electric field applied. However, this external field can degrade thermal stability of neighboring circuitry.

Figure 9:
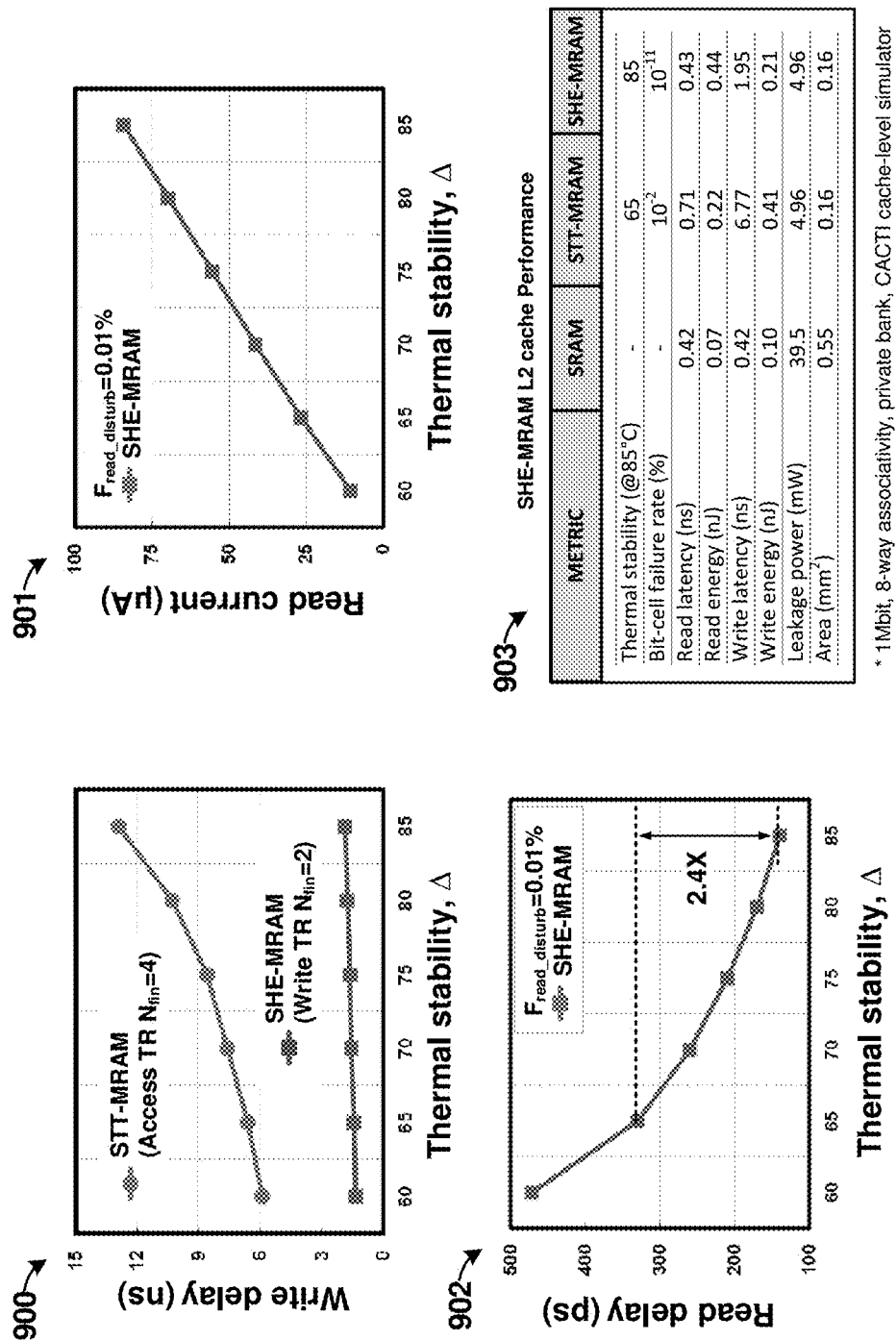
FIG. 9 illustrates example performance of magnetic tunnel junction devices.

Before the enhanced SOT/SHM MTJ based CAM/TCAM structures are discussed, a quick discussion on relative performance among various CAM/TCAM memory cell technologies is presented. FIG. 9 shows performance comparisons among various technologies used to implement memory cell structures, which might be employed in CAM/TCAM designs. FIG. 9 illustrates read performance increases by increasing thermal stability (A) in a SHE-MRAM structure. As can be seen from the graph 900-902 in FIG. 9, SHE-MRAM structures show small write overhead even with higher thermal stability (A) as compared to STT-MRAM structures. Higher A also allows larger read currents. Thus, read delays can be reduced with minimal sacrifice of write delays by the use of SHE-MRAM structures.

In graph 900 of FIG. 9, a comparison in write delay behavior is shown among STT-MRAM devices and SHE-MRAM over increases in thermal stability percentage indicated along the horizontal axis. As can be seen, SHE-MRAM devices maintain lower write delays over a larger range of thermal stability than STT-MRAM devices. In graph 901 of FIG. 9, read current for a SHE-MRAM device is shown over a range of thermal stability shown along the horizontal axis. In graph 902 of FIG. 9, read delay for a SHE-MRAM device is shown over a range of thermal stability shown along the horizontal axis. The read current performance and read delay performance can be affected by choice of material, purity of material, and composition of material for the underlying layer of the SHE-MRAM structure.

Table 903 in FIG. 9 illustrates performance of SHE-MRAM when employed in an level-2 (L2) cache structure. In table 903, a comparison is made among various types of memory cell structures, such as CMOS (SRAM), STT-MRAM, and SHE-MRAM structures. Compared to SRAM devices, SHE-MRAM devices offer similar read latency, but lower leakage and denser area utilization. Compared to STT-MRAM devices, SHE-MRAM devices outperform the STT-MRAM devices with reduced bit-cell failure rates. However, STT-MRAM devices and SHE-MRAM devices have similar area footprints. Moreover, higher tunnel magnetoresistance (TMR) might be employed in SHE-MRAM devices to reduce the read energy needed for the CAM/TCAM structures discussed herein.

Turning now to the enhanced structures for implementing content addressable memory (CAM) and ternary content addressable memory (TCAM) devices, FIG. 1 is presented. As mentioned above, a CAM is a memory which allows lookup of stored data via input search data instead of data addresses as is done with most random-access memory devices. A CAM compares input search data against a table of stored data and returns the address of the matching data. This address can then be used to retrieve the data itself from the memory. Various types of CAMs can be formed, with one exemplary type called a ternary CAM (TCAM). Traditional CAMs require binary formatted input search data. However, TCAMs allow the usage of a third (ternary) state of "don't care" or wildcard for undefined portions of the input search data, so that an exact input search data instance need not be presented to the TCAM to produce a resultant address. FIG. 1 illustrates an example CAM system 100.

In FIG. 1, system 100 input search data 120 is presented to a CAM circuit 110 which compares the input search data against a stored table of data contents of the CAM. If a match is found, then match location 121 is presented as a result. This result can be further presented to random-access memory 111 for use as a lookup address. This lookup address, when presented to the memory, produces output data from random-access memory 111 that corresponds to input search data 120 and match location 121. In the example of FIG. 1, communication network routing 'ports' are used merely to show one common example usage of CAMs. Output data 122 comprises a port used for routing communications based on input search data comprising a network address, although any type of data can instead be used/stored.

Also shown in FIG. 1 is circuit 130 comprising a detailed conceptional view of a CAM. Input search data 120 comprises an n-bit search word in this example, which is held in a search data register for presentation on search lines to lookup table 131 of previously stored words 0 through w. Output encoder 132 presents one or more match locations 134, which might comprise one or more data addresses that corresponds to a storage location associated with input search data 120. In circuit 130, this is shown as storage word w−1 which is presented on an associated match line. Match lines can be referred to as match indicator lines or output lines in some examples. This data address can be used to retrieve the target data from a memory, or for other more direct applications.

One example application of CAM/TCAM structures is in artificial neural networks (ANNs). Artificial neural networks can be formed using conventional processing devices, as well as specialized circuitry. Example processing devices include central processing units (CPUs) or graphical processing units (GPUs), which work well for machine learning applications, such as image recognition, speech recognition, handwriting recognition, among other applications.

To execute machine learning operations, a CPU can be a limited choice due to architectural designs of most CPUs. For example, a CPU is good at handling one set of very complex instructions very efficiently but lacks parallelism. In machine learning computation, especially training operations, a basic operation is vector matrix multiplication. GPUs, which have started to gain favor over CPUs, use parallel architectures and are good at handling many parallel sets of very simple instructions. Another emerging choice is ASICs, such as a tensor processing unit (TPU), which is good at executing one specific task. As machine learning becomes more integrated into daily applications, more interest is grown into making these special purpose chips for machine learning tasks as well as making existing processor-based designs more efficient.

Other than data processing speed, another concern in machine learning and neural networks is power consumption. A machine learning task can take GPUs or TPUs up to hundreds of watts to execute, in contrast to the human brain which can execute similar cognitive tasks by using only around 20 watts. Such power-hungry disadvantages have inspired people to study biologically-inspired or brain-inspired approaches, such as neuromorphic computing, to deal with machine learning power consumption problems. As will be discussed below, another approach is taken to reduce power consumption when using GPUs or other processing devices. This enhanced approach uses a new structure of content addressable memory (CAM) devices to complement the operation of GPUs in neural networks.

As mentioned above, ANNs, such as convolutional neural networks (CNNs), can be implemented using multicore processors formed by GPUs. In GPU architectures, a large amount of energy is consumed by floating point units (FPUs) which include adder (ADD), multiplier (MUL), and multiply-accumulator elements in streaming cores that process data. The enhanced CAM/TCAM examples herein can be employed in ANNs that use processors such as GPUs. Specifically, a content addressable memory (CAM) can be coupled to a processing pipeline in a GPU or other processor. The CAM can be employed to store highly frequent patterns encountered by the CNN. These highly frequent patterns can be efficiently searched via search terms or search data, which can provide significant computation reduction and energy saving in the CNN.

Figure 2:
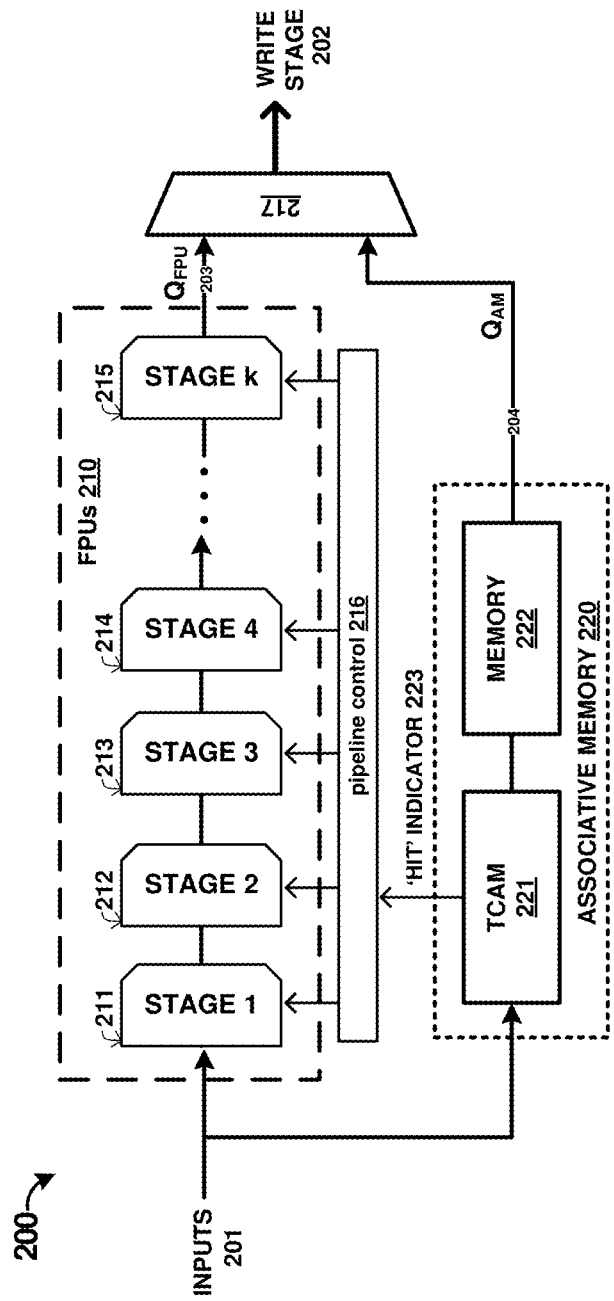
FIG. 2 illustrates an artificial neural network in an implementation.

FIG. 2 is presented which illustrates an example system 200 for application of a CAM into a neural network implementation, which can provide enhanced operation of a GPU-implemented neural network or machine learning task processor. System 200 includes ternary CAM (TCAM) 221 and memory 222 which form associative memory 220 to complement operation of a neural network formed using floating point units (FPUs) 210 in a corresponding GPU. Integration of TCAM 221 beside each FPU in a GPU streaming core provides for computation reduction and energy saving. Specifically, associative memory 220 is provided for looking up highly frequent patterns using input data to TCAM 221. This configuration can provide significant computation reduction and energy saving. As noted above the GPU is a generalized form of GPU used to process any data tasks in addition to mere graphics processing. This type of GPU can be referred to herein as a general-purpose graphics processing unit (GPGPU).

In FIG. 2, inputs 201 are presented to a pipeline of FPU stages 211-215 of FPU 210 within a corresponding GPGPU. A floating-point result ($Q_{FPU}$) results from processing the inputs through the FPU pipeline. Inputs 201 are also concurrently presented to TCAM 221 as input search data. When a search is successful in TCAM 221 (e.g. a search hit), then hit indicator signal 223 is presented to pipeline control circuit 216. Pipeline control circuit 216 can comprise a clock circuit that provides clocking signals to FPU stages 211-215. Hit indicator signal 223 indicates to the clock circuit of pipeline control circuit 216 to gate or otherwise disable clock signals to FPU stages 211-215. Once the hit result produces a data output from the memory associated with TCAM 221, then a corresponding result ($Q_{AM}$) is provided as an output of the pipeline instead of the $Q_{FPU}$ result. Multiplexer 217 is controlled by the hit indicator signal 223 of associative memory 220, which can be provided to select among results presented by $Q_{FPU}$ and $Q_{AM}$.

As can be seen in FIG. 2, when inputs are contained within associative memory 220, then the inputs need not be processed by the FPU pipeline. A significant power savings can be realized by disabling the FPU pipeline in these cases using hit indicator signal 223 and clocking circuitry control. Other means of controlling the FPU pipeline can be implemented other than a clocking control circuit, such as power control gating of the FPU pipeline circuitry elements, logical disabling of the FPU pipeline circuitry, or other techniques. However, when input operands are not contained in associative memory 220, then the FPU pipeline can be enabled to process the inputs to produce a result. Selection among the TCAM-based result or the FPU-based result is achieved based on whether or not a match in the TCAM is indicated.

Associative memory 220 is updated to hold frequent results from processing input operand data through the FPU pipeline. This updating can be performed based on various criteria, such as when results are similar to previous results, or using every result during an initialization period until the associative memory fills to capacity. A subsequent hit can indicate to allow resultant data to remain in the associative memory, and data with few hits associated therewith can be replaced with new results provided by the FPU pipeline. Since TCAM 221 can indicate successful hits based on ternary-formatted data, exact matches need not be presented as input operands to produce a hit. In machine learning applications and other neural network applications, this match/hit can be sufficient to produce results and eliminate power consumption by FPU pipeline stages.

Figure 3:
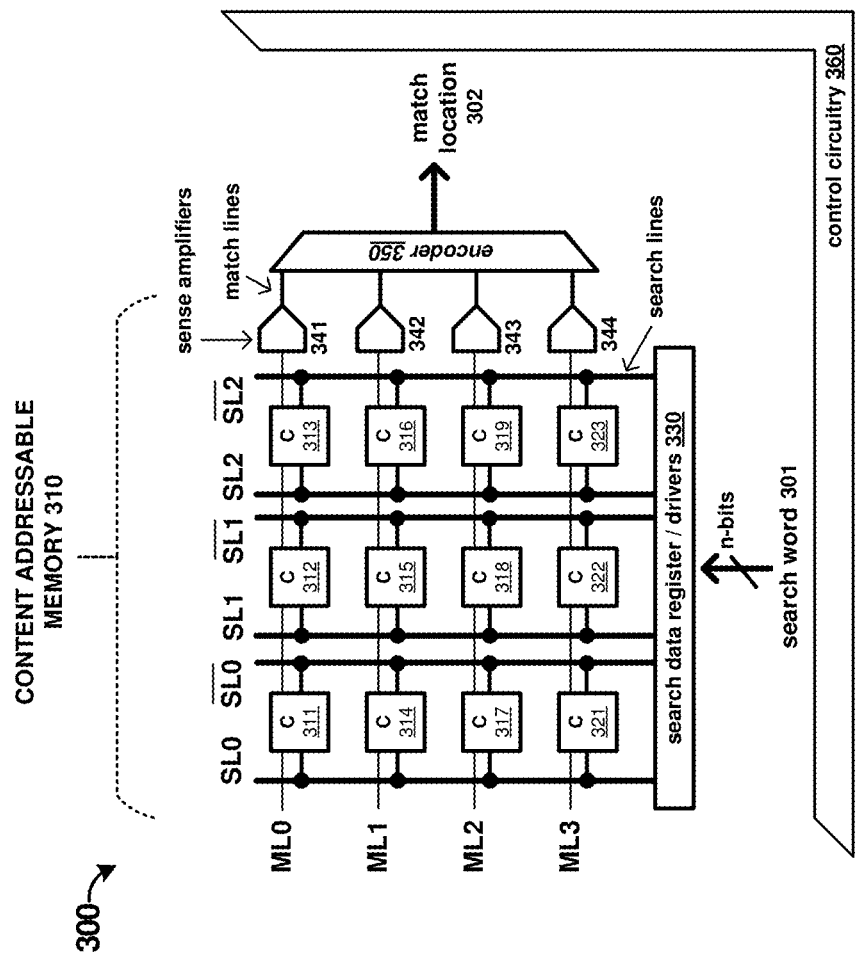
FIG. 3 illustrates a content addressable memory in an implementation.

FIG. 3 presents schematic view 300 of content addressable memory 310. This schematic view has columns of cells (C) 311-323 which comprise CAM or TCAM cells and are coupled in columns to a plurality of search lines (SL0-SL2) and logically complemented search lines ($\overline{SL0}$-$\overline{SL2}$). When the cells of CAM 310 comprise TCAM cells, a plurality of TCAM cells is thus arranged into columns and rows, with TCAM cells of each column coupled via associated search lines, and TCAM cells of each row coupled via associated match lines. As search data is presented on the search lines via search data registers/drivers 330, results can be monitored via rows of match lines (ML) fed into sense amplifiers 341-344. Encoder 350 can present a result based on which match line produces a hit. This result comprises match location 302 or match address.

Control circuitry 360 is configured to write data into CAM 310, present input data as search words 301 to search CAM 310, and read out match locations 302. Control circuitry 360 can comprise discrete control logic, integrated control logic, processing devices, firmware, software, or other control elements that can be employed to control operation of the circuitry presented in FIG. 3, as well as seen below in FIG. 5. Control circuitry 360 can be integrated with one or more instances of the circuitry in FIGS. 3 and 5. For example, when an array of TCAM cells is formed using the circuitry in FIG. 5, then control circuitry 360 can be coupled to shared control lines for the TCAM cells arrayed into rows and columns. Specifically, search lines, write lines, control lines, match lines, and the like can be coupled to control elements of control circuitry 360. When employed in a neural network circuit, such as seen in FIG. 2, this TCAM array can be used to accelerate operation of the neural network as well as reduce power consumption of the neural network when matches are found within the TCAM array for input data.

To implement a TCAM, various approaches can be taken. Referring to FIG. 3, each 'cell' (C) component in content addressable memory 310 can be formed by various memory structures. Typically, these memory structures include non-volatile memory (NVM) elements as well as control logic. Once such NVM element is a spin orbit torque (SOT) MTJ element having an underlying spin-hall effect (SHE) material. Before a discussion on the enhanced TCAM cell structure is presented, we first turn to a brief introduction to the structure of a spin orbit torque (SOT) MTJ element. A non-volatile memory element that incorporates this SOT MTJ element can be referred to as a spin-hall effect (SHE) magnetoresistive random-access memory (MRAM). FIG. 4 illustrates example SHE-MRAM structure 400.

In FIG. 4, a control circuit, not shown, controls a direction of charge movement through a layer of material 431 of spin hall metal (SHM) element 430. According to the spin hall effect, spin of opposite orientations can accumulate on opposite surfaces of the charge-carrying material. When paired with an MTJ element, such as shown for MTJ 420 in FIG. 4, a free layer 423 of MTJ element 420 is mated to the underlying charge-carrying material 431. When current flows through material 431, this current can consequently alter a magnetization state of free layer 423 of MTJ 420 according to the flow of charge through material 431. The magnetization state of free layer 423 of MTJ 420 is altered with respect to fixed or pinned layer 421 that remains in the same magnetic state. MTJ 420 also includes tunnel layer 422 which forms an insulation layer between free layer 423 and pinned layer 421.

Also shown in FIG. 4 are peripheral structures to form a MRAM configuration which allows for writing and reading of a bit of data by changes in magnetization state of MTJ element 420. These structures include read control transistor (440) and write control transistor (441), as well as various control lines. Moreover, structure 400 includes spin hall metal (SHM) element 430 comprising two terminals 432-433 and spin hall effect material 431.

Operation of the SHE-MRAM structure shown in FIG. 4 can proceed according to voltages presented in table 401. In operation, a first control transistor 440 or read switch element controls a read pathway, and is coupled via a gate terminal to RWL line 411 of FIG. 4. A second control transistor 441 or write switch element controls a write pathway, and is coupled via a gate terminal to WWL line 412 of FIG. 4. During a write operation, when WWL line 412 is enabled and the corresponding write control transistor 441 is in an 'on' state, then a voltage present between search line (SL) 414 and bit line (BL) 413 introduces a corresponding current through material 431 which can alter a magnetoresistance or magnetization state of free layer 423 of MTJ element 420. A logical '1' or '0' can be stored in SHE-MRAM structure 400 based on the direction of current flow between the SL and BL lines. During a read operation, when RWL line 411 is enabled and the corresponding read control transistor 440 is in an 'on' state, a read voltage ($V_{READ}$) presented on BL line 413 can be employed to detect a present magnetoresistance or magnetization state of free layer 423 with respect to pinned layer 421 of MTJ element 420.

Advantageously, the SHE-MRAM structure in FIG. 4 provides a low current (i.e. $I_{CHANNEL}$ though underlying material 431) per unit thermal stability ($\Delta$), i.e. low $I_{CHANNEL}/\Delta$, with efficient spin generation per unit charge current (i.e. $I_{SPIN}/I_{CHARGE}$>100%). Example materials for material 431 include spin hall metal (SHM) material comprising tungsten (W) and tantalum (Ta), among others, which can affect the thermal stability of the SHE-MRAM structure. In some examples, beta ($\beta$) configurations of W and Ta are employed, such as $\beta$-W (beta-tungsten or $\beta$-tungsten) and $\beta$-Ta (beta-tantalum or $\beta$-tantalum) materials. Moreover, the SHE-MRAM structure provides separate read and write paths allowing longer device lifetimes. Specifically, less current is required for read operations in the SHE-MRAM structure above than compared to other MRAM or CMOS structures, which can lead to longer structure durations.

Figure 5:
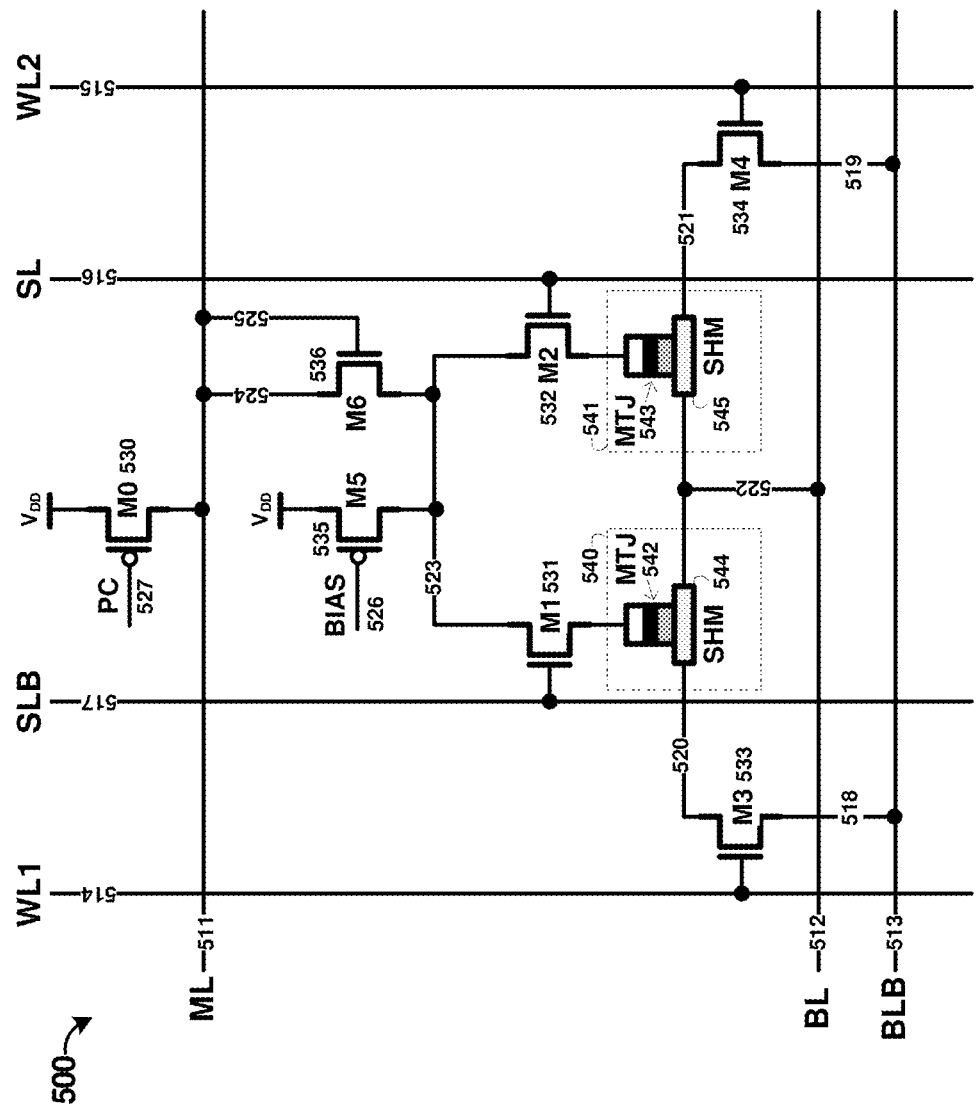
FIG. 5 illustrates an example content addressable memory with spin orbit torque devices in an implementation.

We now turn to an example implementation of a SHE-MRAM device-based TCAM cell. FIG. 5 illustrates an enhanced CAM/TCAM cell structure with SHE (SOT)-MRAM elements. Specifically, FIG. 5 shows circuit 500 comprising a six-transistor (6T) Spin-Hall Effect (SHE) Magnetoresistive Random-Access Memory (MRAM) based ternary content addressable memory (TCAM). Two SHE-MRAM structures 540-541 are included in circuit 500. Each SHE-MRAM structure comprises a spin orbit torque (SOT) MTJ configuration which includes an MTJ (542, 543) coupled to an underlying Spin-Hall metal (SHM) layer (544, 545). The layer of each SOT MTJ that is coupled to the corresponding SHM layer is a free layer of the MTJ, while a tunnel layer and pinned layer follow upwards from the free layer in the MTJ stackup. A detailed view of the layers is shown previously in FIG. 4, and the view shown in FIG. 5 is merely illustrative.

As mentioned above, circuit 500 comprises a 6T SHE-MRAM based TCAM. The six transistors include M1-M6. M1 and M2 comprise read control transistors 531-532. M3 and M4 comprise write control transistors 533-534. M5 comprises a bias control transistor 535. M6 comprises a voltage keeper configuration formed by transistor 536. Additionally, M0 is includes which comprises pre-charge control transistor 530. In this example, M1, M2, M3, M4, and M6 comprise negative channel metal oxide semiconductor (NMOS) transistors, while M0 and M5 comprise positive channel metal oxide semiconductor (PMOS) transistors. Other suitable switching elements or selection components can instead be employed for M1, M2, M3, M4, and M6.

It should be noted that the "B" notation used on control lines in FIG. 5 indicates a logically-complementary or logically-complemented version of a companion signal. For example, line SLB (517) is a logically-complemented version of line SL (516). A complemented version refers to a logical negation or logical inverse of a particular signal or logical value. For example, when line SL is at a particular voltage level, such as $V_{DD}$, or a logical '1', then line SLB is at a complemented voltage level, namely 0V or logical '0'.

Turning now to the structure of circuit 500, read control transistors 531, 532 (M1, M2) are included to control a read current through each SHM layer (544, 545) for the SHE-MRAM structures. Read control transistors 531, 532 are controlled by SL and SLB lines (516, 517), which comprise search lines for circuit 500. Read control transistors 531, 532 are also of a smaller relative feature size due to the smaller read currents employed for the SOT MTJ structures as compared to STT MTJ structures discussed above. Write control transistors 533, 534 (M3, M4) are included to control a write current through each SHM layer (544, 545) of the SHE-MRAM structures. Write control transistors 533, 534 are controlled by WL1 and WL2 lines (514, 515), which comprise write lines for circuit 500. Thus, separate read and write paths are achieved using read lines and write lines. Write control transistors 533, 534 are also of a smaller relative size compared to STT MTJ structures due to the larger tunnel magnetoresistance (TMR) properties of the SOT MTJ configuration.

Further control elements are included in the TCAM cell structure of FIG. 5. First, a pre-charge transistor 530 (M0) comprises a pre-charge element configured to pull ML 511 to a predetermined voltage level, such as $V_{DD}$ prior to a read/search operation. Pre-charge transistor 530 couples a corresponding match line 511 to a predetermined voltage responsive to a pre-charge control signal (PC). Bias transistor 535 (M5) is included to bias a voltage onto common node 523 shared among the read transistors 531, 532 of the TCAM cell structure. Bias transistor 535 is configured to provide a bias voltage to drain terminals of read control transistor 531 and read control transistor 532 responsive to a bias control signal (BIAS). The bias voltage is typically of a level lower than $V_{DD}$, such as zero volts or alternatively a field-effect transistor threshold voltage ($V_{TH}$) for the PMOS transistor shown for M5.

A further element 536 (M6) is included as a voltage keeper for ML 511. In this example, voltage keeper element 536 comprises a diode-connected NMOS transistor. The voltage keeper function is to maintain sufficient ML 511 voltage swing for parallel search operations when many TCAM cells are included in an array along with the TCAM cell included in circuit 500. Voltage keeper element 536 couples drain terminals of read control transistor 531 and read control transistor 532 to a corresponding match line 511. FIG. 3 shows an example array with many TCAM cells. During search operations, ML 511 is continuously discharged through voltage keeper 536 in a TCAM cell which does not match a search input responsive to a search input presented to the TCAM cell on SL/SLB lines 516, 517. When ML 511 is discharged, each voltage keeper 536 of the TCAM cell array are changed to a sub-threshold region, and a change in voltage on ML 511 (AVML) is slightly degraded by a logarithmic scale along with the word length of the search input. However, due to the voltage keepers 536, ML 511 maintains a sufficient voltage swing for sensing more than 0.1V. Thus, a match in the TCAM cell discharges ML 511 more slowly than a mismatch, and ML 511 also remains at a pre-charge level in the match scenario for a longer duration than a mismatch scenario.

Six transistors employed in the example SHE-MRAM device of FIG. 5 to achieve separate read and write paths. Thus, a larger structure footprint might be assumed with regard to a comparable four-transistor STT-MRAM devices. However, read control transistors 531, 532 in the SHE-MRAM device are correspondingly small, and the SOT MTJ structure in FIG. 5 has a comparatively smaller footprint than an STT MTJ structure. Thus, even though additional transistor structures might be employed in the SHE-MRAM device to achieve the separate read and write paths, the six-transistor SHE-MRAM is comparable in size to a four-transistor STT-MRAM structure with the additional advantages described above for separate read/write paths, as well as enhanced performance, and enhanced thermal stability.

As mentioned above, circuit 500, which implements an example enhanced TCAM cell structure, employs two spin-orbit torque (SOT) magnetic tunnel junction (MTJ) elements with underlying spin hall effect (SHE) layers to form two SHE-MRAM structures. A first spin-orbit torque (SOT) magnetic tunnel junction (MTJ) element 542 has a pinned layer coupled to first search control transistor 531 controlled by first search line 517. The first SOT MTJ element 542 has a spin hall effect (SHE) layer comprising SHM 544. A second SOT MTJ element 543 has a pinned layer coupled to a second search control transistor 532 controlled by second search line 516. The second SOT MTJ element 543 also has a SHE layer comprising SHM 545. The first search control transistor 531 and the second search control transistor 532 can be referred to as read control transistors.

SHM 544 is coupled to complemented write inputs 512, 513 (BL, BLB) in a first configuration. As used herein, the first configuration refers to a specific arrangement and set of connections between complemented write inputs 512, 513 (BL, BLB) and SHM 544. Complemented write inputs 512, 513 (BL, BLB) and SHM 544 may be arranged and connected in different configurations that are still within the scope of the claims in this disclosure. Furthermore, the first configuration that includes complemented write inputs 512, 513 (BL, BLB) and SHM 544, in certain embodiments, may also include additional components such as write control transistor 533 that is configured to control when a write current or voltage is applied to the SHM 544 component. This first configuration couples the corresponding SHE layer according to a first voltage polarity with regard to complemented write inputs 512, 513 (BL, BLB). In this example, write control transistor 533 applies complemented write inputs 512, 513 to SHM 544 in a selected configuration to establish a voltage across SHM 544 according to a desired current flow direction. Complemented write inputs 512, 513 carry logically-complimented signal levels during a write operation to SHM 544. Logically-complemented signal levels each have a corresponding voltage which represents opposite logical states, such as '0' and '1' among other logical representations. Lines 518, 520, and 522 further couple write inputs 512, 513 to SHM 544 through write control transistor 533. Write control transistor 533 is controlled by first write control line 514 (WL1).

SHM 545 is coupled to complemented write inputs 512, 513 (BL, BLB) in a second configuration, also referred to as a second configuration. As used herein, the second configuration refers to a specific arrangement and set of connections between complemented write inputs 512, 513 (BL, BLB) and SHM 545. Complemented write inputs 512, 513 (BL, BLB) and SHM 545 may be arranged and connected in different configurations that are still within the scope of the claims in this disclosure. Furthermore, the second configuration that includes complemented write inputs 512, 513 (BL, BLB) and SHM 545, in certain embodiments, may also include additional components such as write control transistor 534 that is configured to control when a write current or voltage is applied to SHM 545. This second configuration couples the corresponding SHE layer according to a second voltage polarity with regard to complemented write inputs 512, 513 (BL, BLB). In this example, write control transistor 534 applies complemented write inputs 512, 513 to SHM 545 in a selected configuration to establish a voltage across SHM 545 according to a desired current flow direction. Complemented write inputs 512, 513 carry logically-complimented signal levels during a write operation to SHM 545. Logically-complemented signal levels each have a corresponding voltage which represents opposite logical states, such as '0' and '1' among other logical representations. Lines 519, 521, and 522 further couple write inputs 512, 513 to SHM 545 through write control transistor 534. Write control transistor 534 is controlled by second write control line 515 (WL2).

Operation of the SHE-MRAM device-based TCAM circuit 500 is detailed in FIG. 6. When deployed in an array, many SHE-MRAM based TCAM cells can be arranged to share control lines, such search lines (SL) and match lines (ML) as seen in the example of FIG. 3. In this configuration, an array of TCAM cells is arrayed into various rows and columns.

Prior to search/read operations of the TCAM, data values can be written into the TCAM. Write control transistors 533, 534 (M3, M4) control current flow through corresponding SHM layers 544, 545 for write operations to MTJ elements 542, 543. In an example write operation, the WL lines 514, 515 (WL1/WL2) can be individually enabled and the corresponding write control transistor (M3, M4) placed in an 'on' state. Then a voltage present between the BL and BLB lines introduces a corresponding current through the underlying SHM material which can alter a magneto-resistance/magnetization state of the free layer of the corresponding MTJ element. Magneto-resistance states of MTJ elements 542, 543 can be in a parallel or anti-parallel state. Parallel MTJ states indicate the pinned layer and free layer have the same magnetization state. Anti-parallel MTJ states indicate the pinned layer and free layer have a different magnetization state. Thus, a logical '1' or '0' can be stored in the MTJ element based on the direction or polarity of current flow between the BL/BLB lines. In this example, a logical '1' corresponds to a parallel MTJ state, while a logical '0' corresponds to an anti-parallel MTJ state, although other configurations are possible.

WL1 is configured to control write control transistor 533 (M3) and write data into the left-hand side MTJ structure, where the data is based on the current flow between the BL/BLB lines. WL2 is configured to control write control transistor 534 (M4) and write data into the right-hand side MTJ structure, based on the current flow between the BL/BLB lines. WL1 is enabled concurrently or in a sequential fashion with WL2 depending upon the data to be written, due in part to the sharing of the BL/BLB lines. FIG. 5 above shows example write values for BL/BLB lines in a corresponding truth table.

Depending on the direction or polarity of current flow through corresponding SHM layers 544, 545, the write process for each of SHE-MRAM structures 540-541 can write either a logical '1' or '0' into corresponding SOT MTJ elements 542, 542. Table 600 of FIG. 6 shows write voltages to achieve a logical '1' or '0' in SOT MTJ elements 542, 542.

For a first write scenario, (MTJ 542=0, MTJ 543=1), a control circuit can apply BL=$V_{DD}$, BLB=GND while applying WL1=WL2=$V_{DD}$ (i.e. both M3/M4 turned on). This first write scenario thus writes both MTJ 542 and MTJ 543 at the same time. For a second write scenario (MTJ 542=1, MTJ 543=0), a control circuit can apply BL=GND, BLB=$V_{DD}$ while still applying WL1=WL2=$V_{DD}$. This second write scenario also writes both MTJ 542 and MTJ 543 at the same time. However, for a third scenario (MTJ 542=0, MTJ 543=0), a control circuit needs to write SOT MTJ elements 542, 542 sequentially. For instance, a control circuit can apply BL=$V_{DD}$, BLB=GND to write a '0' into MTJ 542 first, while applying WL1=$V_{DD}$, WL2=GND (i.e. M3 turned on, M4 turned off). Then, the control circuit can switch to applying BL=GND, BLB=$V_{DD}$ to write a '0' into MTJ 543, while applying WL1=GND, WL2=$V_{DD}$ (i.e. M3 turned off, M4 turned on).

In FIG. 6, a two-step search/read operation is provided by the SHE-MRAM based TCAM cell, namely pre-charge and evaluation phases. In the pre-charge phase, the read control transistors (M1, M2) are turned off via SL/SLB lines, and match line (ML) 511 is charged to $V_{DD}$, using a pre-charge control signal (PC) to enable pre-charge transistor 530. Once pre-charged, then pre-charge transistor 530 is disabled. Then, in an evaluation phase, the MRAM cells 540, 541 are activated via read control transistors M1, M2, and the voltage on ML 511 gradually pulls down through MRAM cells 540, 541. A logic state of MRAM cells 540, 541, which is stored as magneto-resistance states (i.e. magnetization states) of MTJ elements 542, 543, determines the rate of discharge of the voltage on ML 511, indicating a logical value. For example, when the search data presented on the SL/SLB lines and the stored data in MTJ elements 542, 543 are equal, then the discharge of ML 511 is relatively slow so that ML 511 remains at a relatively high voltage level, representing a logical '1' indicating a match. When the search data presented on the SL/SLB lines and the stored data in MTJ elements 542, 543 are not equal, then the discharge of ML 511 is relatively fast so that ML 511 does not remain at a relatively high voltage level, representing a logical '0' indicating a mismatch.

Table 600 shown in FIG. 6 represents further the correspondence between stored data in MTJ elements 542, 543, search lines, and match lines. Magneto-resistance states of MTJ elements 542, 543 can represent either a '1' or '0' binary value. A ternary state ('X' value) is enabled by the structure of the two MTJ elements and associated control transistors/interconnect. SL 'search' values are shown in table 600 which can correspond to these magneto-resistance states. When the SL values of table 600 are presented on the search lines (SL/SLB) of a TCAM array, then an output can be indicated on the match lines of the TCAM array. This output indicates a match or unmatched response to the search line values.

Control circuitry, such as discrete control logic, integrated control logic, processing devices, firmware, software, or other control elements can be employed to control operation of the circuitry presented in FIG. 5. This control circuitry can be integrated with one or more instances of the circuit in FIG. 5. For example, when an array of TCAM cells is formed using the circuit in FIG. 5, then control circuitry can be coupled to shared control lines for the TCAM cells arrayed into rows and columns. Specifically, the SL/SLB, WL1/WL2, and BL/BLB lines can be coupled to input driver circuitry as seen in FIG. 3. Match lines (ML) can be coupled to sense amplifiers and further output circuitry for presentation of data match states to further circuitry or processing devices. When employed in a neural network circuit, such as seen in FIG. 2, this TCAM array can be used to accelerate operation of the neural network as well as reduce power consumption of the neural network when matches are found within the TCAM array for input data.

In a further example circuit, which might be employed as a TCAM cell, a first magnetoresistive random-access memory (MRAM) structure comprises a first magnetic tunnel junction (MTJ) element coupled at a corresponding free layer to a first Spin Hall Metal (SHM) layer. This first MTJ element is coupled at a corresponding pinned layer to a first read control transistor (M1) controlled by a first search line (SLB). The first SHM layer comprises a first terminal coupled to a first write control transistor (M3) controlled by a first write line (WL1), and a second terminal coupled to a bit line (BL). A second MRAM structure comprises a second MTJ element coupled at a corresponding free layer to a second SHM layer. This second MTJ element is coupled at a corresponding pinned layer to a second read control transistor (M2) controlled by a second search line (SL). The second SHM layer comprises a first terminal coupled to a second write control transistor (M4) controlled by a second write line (WL2), and a second terminal coupled to the bit line (BL). The circuit can include a bias transistor (M5) configured to provide a bias voltage to the first read control transistor (M1) and the second read control transistor (M2). When employed in an array that has more than one TCAM cell sharing the ML, this circuit can include a voltage keeper element (M6) coupled between a match line and the bias voltage, and a pre-charge element (M0) coupled to the match line (ML).

Figure 7:
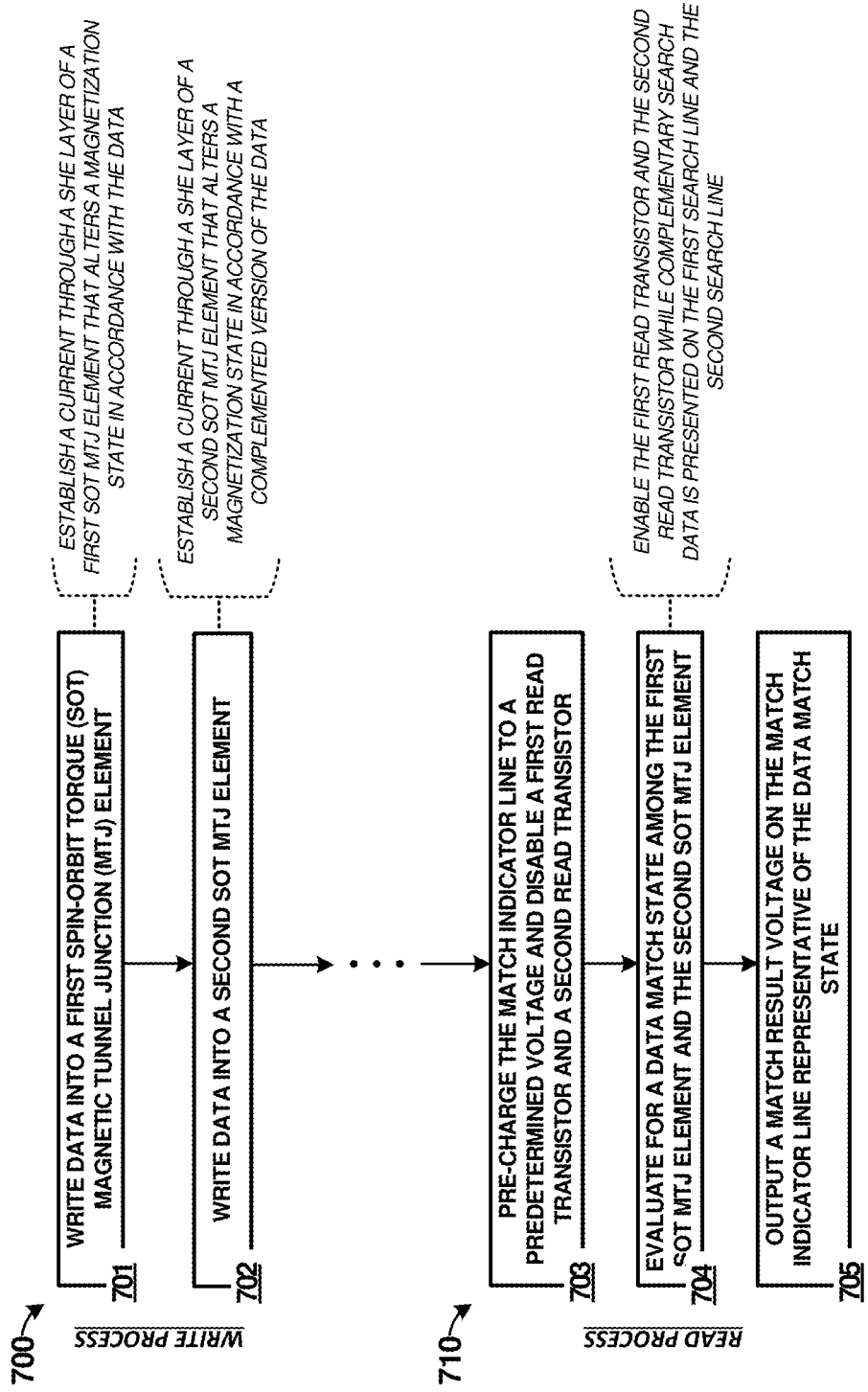
FIG. 7 illustrates example operations of a content addressable memory with spin orbit torque devices in an implementation.

FIG. 7 presents an additional example operation of the circuitry discussed above, such as that for FIG. 5. In FIG. 7, write process 700 is discussed in operations 701-702, while search or read process 710 is discussed in operations 703-705. Example detailed operations are also presented for some of the operations of FIG. 7 to provide further details on each associated step.

In write process 700, a control circuit writes data into a first spin-orbit torque (SOT) magnetic tunnel junction (MTJ) element of a TCAM cell. With relation to elements of FIG. 5, a control circuit can write (701) data into the first MRAM structure (540) by at least enabling a first write control transistor 533 (M3) and presenting a write voltage level between a first terminal (520) of first SHM 544 and a second terminal (522) of first SHM 544 to establish a current through first SHM 544 that alters a magnetization state of first MTJ element 542 in accordance with the data. The control circuit can write (702) data into a second MRAM structure (541) by at least enabling a second write control transistor 534 (M4) and presenting a write voltage level between a first terminal (521) of second SHM 545 and a second terminal (522) of second SHM 545 to establish a current through second SHM 545 that alters a magnetization state of second MTJ element 543 in accordance with a complemented version of the data. The write voltage is introduced to the circuit between lines BLB and BL (512, 513) in FIG. 5.

In read process 710, a control circuit reads from a TCAM cell. Typically, many TCAM cells are placed into an arrayed configuration and the read operation spans many TCAM cells in parallel. This read operation is often referred to as a search operation. With relation to elements of FIG. 5, a control circuit can first pre-charge (703) a match indicator line, namely match line (ML) 511, to a predetermined voltage. The pre-charge is performed by at least disabling first read control transistor 531 (M1) and second read control transistor 532 (M2) and subsequently bringing ML 511 to the predetermined voltage with pre-charge element 530 (M0). Pre-charge element or transistor 530 is controlled using PC control line 527.

After pre-charging ML 511, a search or read process can evaluate (704) for a data match state within the TCAM cell by evaluating input data against data previously stored into first MRAM structure 540 and second MRAM structure 541. A data match state indicates a TCAM cell evaluation result from search data or read data transmitted onto search lines or read lines. This data match state can indicate a binary match, binary mismatch, ternary match, ternary mismatch, or other result indicating how data stored in the TCAM cell compares to the search data. This evaluation is performed by at least enabling first read control transistor 531 (M1) and second read control transistor 532 (M2) while complemented search data is presented on first search line 517 (SLB) and second search line 516 (SL) to responsively output (705) a resultant voltage on ML 511 representing the data match state. Due in part to voltage keeper element 536 (M6) allowing M1 and M2 to sink current from ML 511 via common node 523, a resultant voltage on ML 511 comprises a predetermined voltage when a match is determined among the search data and data stored in first SOT MTJ 542 and second SOT MTJ 543. The resultant voltage comprises a voltage level below the predetermined voltage when a mismatch is determined among the search data and data stored in first SOT MTJ 542 and second SOT MTJ 543. Specifically, a match state will discharge ML 511 at a slower rate than a mismatch state, and thus a match allows for the pre-charged voltage on ML 511 to remain above a specified threshold longer than a mismatch.

As discussed herein, SHE-MRAM device-based TCAMs have several advantages over STT-MRAM TCAMs. For example, SHE-MRAM device-based TCAMs have faster searches by employing larger read currents as compared to STT-MRAM device-based TCAMs. SHE-MRAM device-based TCAMs are more robust to data retention failure due in part to having separate read/write paths enabled by SOT-MRAM elements. Lower write currents are also enabled by the SOT-MRAM elements, while still maintaining near-zero static power dissipation and compact bit-cell size as compared to CMOS-based TCAMs. Fabrication area overhead of the elements of the SHE-MRAM device-based TCAM circuitry detailed in FIG. 5 are also advantageous. For example, M1, M2 transistors can be smaller than those in STT or CMOS based TCAMs in part since M1, M2 are only used for read operations. Even though an additional two write control transistors (M3, M4) are employed in the SHE-MRAM device-based TCAM, these transistors are relatively small due to the comparatively low SOT-MRAM write current.

Thus, the SHE-MRAM configuration presented herein can boost read speed of TCAM cells with larger read currents by increasing thermal stability since the corresponding write overhead is not significant due to high spin polarization efficiency. SHE-MRAM device-based TCAMs can be employed successfully in SOT-MRAM based artificial neural network engines, such as those discussed above in FIG. 2.

Figure 8:
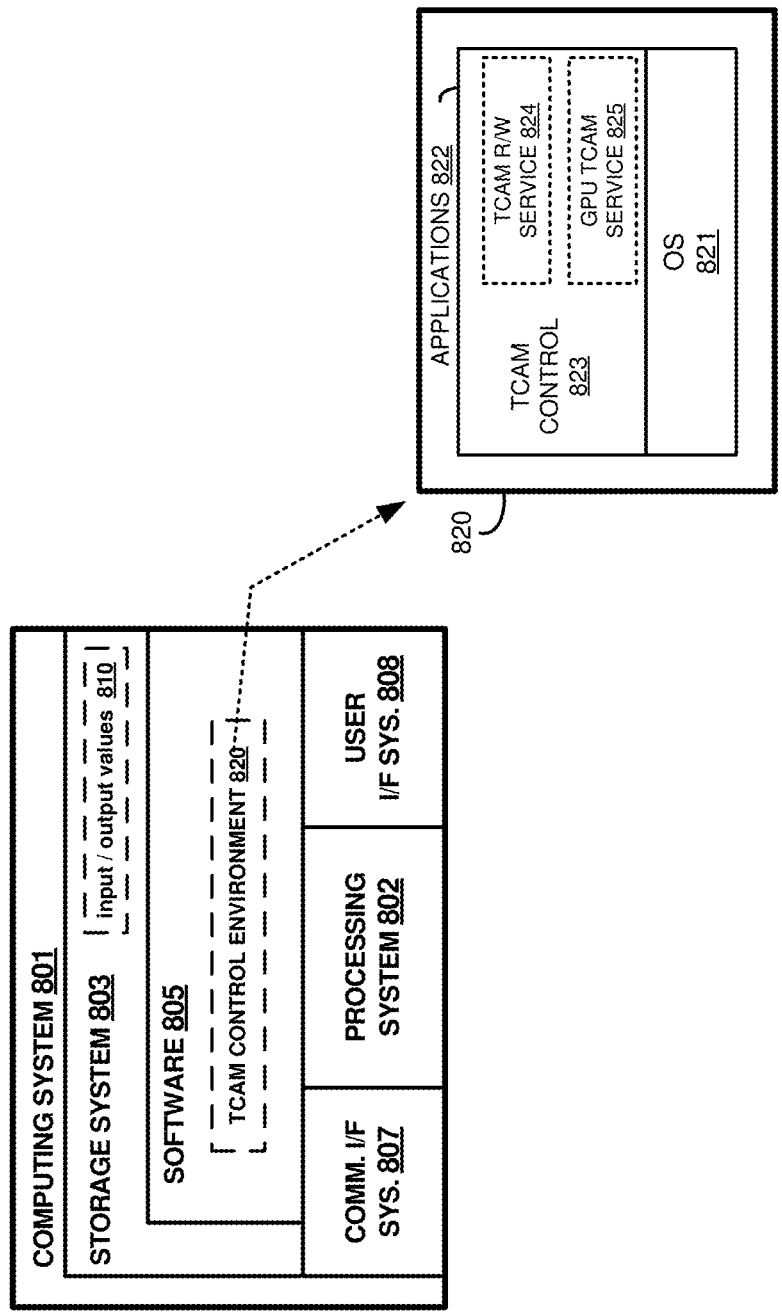
FIG. 8 illustrates a computing system to host or control an artificial neural network or content addressable memory with spin orbit torque devices according to an implementation.

FIG. 8 illustrates computing system 801 that is representative of any system or collection of systems in which the various operational architectures, scenarios, and processes disclosed herein may be implemented. For example, computing system 801 can be used to implement control circuitry for elements of FIG. 1, control portions of elements of FIG. 2, as well as FPU stages of FIG. 2, control circuitry 360 of FIG. 3, control circuitry of FIG. 5, and other circuitry discussed herein. Moreover, computing system 801 can be used to store write data before storage into TCAM cells, and store search results after search processes complete. In further examples, computing system 801 can configure interconnect circuitry to establish one or more arrays of TCAM cells or to connect TCAM cells into artificial neural network circuitry. In yet further examples, computing system 801 can fully implement an artificial neural network, such as that illustrated in FIG. 2, to create an at least partially software-implemented artificial neural network with externally-implemented enhanced TCAM cell structures. Computing system 801 can implement control of any of the TCAM cell operations discussed herein, whether implemented using hardware or software components, or any combination thereof.

Examples of computing system 801 include, but are not limited to, computers, smartphones, tablet computing devices, laptops, desktop computers, hybrid computers, rack servers, web servers, cloud computing platforms, cloud computing systems, distributed computing systems, software-defined networking systems, and data center equipment, as well as any other type of physical or virtual machine, and other computing systems and devices, as well as any variation or combination thereof.

Computing system 801 may be implemented as a single apparatus, system, or device or may be implemented in a distributed manner as multiple apparatuses, systems, or devices. Computing system 801 includes, but is not limited to, processing system 802, storage system 803, software 805, communication interface system 807, and user interface system 808. Processing system 802 is operatively coupled with storage system 803, communication interface system 807, and user interface system 808.

Processing system 802 loads and executes software 805 from storage system 803. Software 805 includes TCAM control environment 820, which is representative of the processes discussed with respect to the preceding Figures. When executed by processing system 802 to implement and enhance TCAM operations or ANN operations, software 805 directs processing system 802 to operate as described herein for at least the various processes, operational scenarios, and sequences discussed in the foregoing implementations. Computing system 801 may optionally include additional devices, features, or functionality not discussed for purposes of brevity.

Referring still to FIG. 8, processing system 802 may comprise a microprocessor and processing circuitry that retrieves and executes software 805 from storage system 803. Processing system 802 may be implemented within a single processing device, but may also be distributed across multiple processing devices, sub-systems, or specialized circuitry, that cooperate in executing program instructions and in performing the operations discussed herein. Examples of processing system 802 include general purpose central processing units, application specific processors, and logic devices, as well as any other type of processing device, combinations, or variations thereof.

Storage system 803 may comprise any computer readable storage media readable by processing system 802 and capable of storing software 805, and capable of optionally storing TCAM input/output values 810. Storage system 803 may include volatile and nonvolatile, removable and non-removable media implemented in any method or technology for storage of information, such as computer readable instructions, data structures, program modules, or other data.

Examples of storage media include random access memory, read only memory, magnetic disks, optical disks, flash memory, virtual memory and non-virtual memory, magnetic cassettes, magnetic tape, magnetic disk storage or other magnetic storage devices, resistive storage devices, magnetic random-access memory devices, phase change memory devices, or any other suitable non-transitory storage media.

In addition to computer readable storage media, in some implementations storage system 803 may also include computer readable communication media over which at least some of software 805 may be communicated internally or externally. Storage system 803 may be implemented as a single storage device, but may also be implemented across multiple storage devices or sub-systems co-located or distributed relative to each other. Storage system 803 may comprise additional elements, such as a controller, capable of communicating with processing system 802 or possibly other systems.

Software 805 may be implemented in program instructions and among other functions may, when executed by processing system 802, direct processing system 802 to operate as described with respect to the various operational scenarios, sequences, and processes illustrated herein. For example, software 805 may include program instructions for controlling and interfacing with enhanced TCAM circuitry, among other operations.

In particular, the program instructions may include various components or modules that cooperate or otherwise interact to carry out the various processes and operational scenarios described herein. The various components or modules may be embodied in compiled or interpreted instructions, or in some other variation or combination of instructions. The various components or modules may be executed in a synchronous or asynchronous manner, serially or in parallel, in a single threaded environment or multi-threaded, or in accordance with any other suitable execution paradigm, variation, or combination thereof. Software 805 may include additional processes, programs, or components, such as operating system software or other application software, in addition to or that include TCAM control environment 820. Software 805 may also comprise firmware or some other form of machine-readable processing instructions executable by processing system 802.

In general, software 805 may, when loaded into processing system 802 and executed, transform a suitable apparatus, system, or device (of which computing system 801 is representative) overall from a general-purpose computing system into a special-purpose computing system customized to facilitate controlling and interfacing with enhanced TCAM circuitry. Indeed, encoding software 805 on storage system 803 may transform the physical structure of storage system 803. The specific transformation of the physical structure may depend on various factors in different implementations of this description. Examples of such factors may include, but are not limited to, the technology used to implement the storage media of storage system 803 and whether the computer-storage media are characterized as primary or secondary storage, as well as other factors.

For example, if the computer readable storage media are implemented as semiconductor-based memory, software 805 may transform the physical state of the semiconductor memory when the program instructions are encoded therein, such as by transforming the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate the present discussion.

TCAM control environment 820 includes one or more software elements, such as OS 821 and applications 822. These elements can describe various portions of computing system 801 with which elements of TCAM arrays, TCAM cells, control systems, artificial neural networks, or external systems can interface or interact. For example, OS 821 can provide a software platform on which application 822 is executed and allows for enhanced TCAM operations and control.

In one example, TCAM control environment 820 includes TCAM control 823. TCAM control 823 can include TCAM read/write (R/W) service 824 and GPU TCAM service 825. TCAM R/W service 824 can control writing of data into TCAM cells or arrays over corresponding write control lines and write data lines, such as WL1/WL2 and BL/BLB in FIG. 5. TCAM R/W service 824 can control enabling/disabling of write control transistors in correct sequencing to properly write data into TCAM cells and TCAM arrays. TCAM R/W service 824 also can perform search or read operations. TCAM R/W service 824 can control searching for matches on data previously written into TCAM cells or TCAM arrays using bias control lines, pre-charge control lines, search data lines, and read transistor control lines, such as PC, BIAS, and SL/SLB lines in FIG. 5. TCAM R/W service 824 can read results presented on match lines (MLs). In some examples, TCAM R/W service 824 can implement output encoder/decoders or multiplexer logic to assemble discrete search result values into bit vectors or to handle multiple search match outputs produced by a TCAM. TCAM R/W service 824 can transmit resultant search match/mismatch indications to one or more further systems over communication interface 807, or present the resultant search match/mismatch indication to one or more users over user interface system 808.

GPU TCAM service 825 can include control functionality when TCAM structures are employed in GPU-implemented ANNs or CNNs. GPU TCAM service 825 can present inputs to GPU or GPGPU-based ANNs. These inputs can be concurrently presented to TCAM structures as input search data. GPU TCAM service 825 can control when to write data into associative memory comprising a TCAM based on frequent results determined by an associated ANN/CNN. GPU TCAM service 825 can control the enabling or disabling of pipeline stages in GPU/FPU pipelines when TCAM hits are encountered using input data. GPU TCAM service 825 can implement output circuitry, such as multiplexing circuitry to select among results presented by FPU stages or TCAM structures based on TCAM hits encountered using input data.

Communication interface system 807 may include communication connections and devices that allow for communication with other computing systems (not shown) over communication networks (not shown). Communication interface system 807 might also communicate with portions of hardware-implemented ANNs, such as with layers of ANNs, or TCAM structures and circuitry. Examples of connections and devices that together allow for inter-system communication may include NVM memory interfaces, network interface cards, antennas, power amplifiers, RF circuitry, transceivers, and other communication circuitry. The connections and devices may communicate over communication media to exchange communications or data with other computing systems or networks of systems, such as metal, glass, air, or any other suitable communication media.

User interface system 808 is optional and may include a keyboard, a mouse, a voice input device, a touch input device for receiving input from a user. Output devices such as a display, speakers, web interfaces, terminal interfaces, and other types of output devices may also be included in user interface system 808. User interface system 808 can provide output and receive input over a data interface or network interface, such as communication interface system 807. User interface system 808 may also include associated user interface software executable by processing system 802 in support of the various user input and output devices discussed above. Separately or in conjunction with each other and other hardware and software elements, the user interface software and user interface devices may support a graphical user interface, a natural user interface, or any other type of user interface.

Communication between computing system 801 and other computing systems (not shown), may occur over a communication network or networks and in accordance with various communication protocols, combinations of protocols, or variations thereof. Examples include intranets, internets, the Internet, local area networks, wide area networks, wireless networks, wired networks, virtual networks, software defined networks, data center buses, computing backplanes, or any other type of network, combination of network, or variation thereof. The aforementioned communication networks and protocols are well known and need not be discussed at length here. However, some communication protocols that may be used include, but are not limited to, the Internet protocol (IP, IPv4, IPv6, etc.), the transmission control protocol (TCP), and the user datagram protocol (UDP), as well as any other suitable communication protocol, variation, or combination thereof.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the disclosure. Those skilled in the art will also appreciate that the features described above can be combined in various ways to form multiple embodiments. As a result, the invention is not limited to the specific embodiments described above, but only by the claims and their equivalents.

What is claimed is:

1. A content addressable memory (CAM) circuit comprising:
    a first spin-orbit torque (SOT) magnetic tunnel junction (MTJ) element having a pinned layer coupled to a first read transistor controlled by a first search line, and having a spin hall effect (SHE) layer coupled in a first configuration across complemented write inputs;
    a second SOT MTJ element having a pinned layer coupled to a second read transistor controlled by a second search line, and having a SHE layer comprising a spin-hall metal (SHM) coupled in a second configuration across the complemented write inputs;
    a bias transistor configured to connect a bias voltage to drain terminals of the first read transistor and the second read transistor; and
    a voltage keeper element that couples the drain terminals of the first read transistor and the second read transistor to a match indicator line.

2. The CAM circuit of claim 1, comprising:
    the SHE layer of the first SOT MTJ element coupled in the first configuration across the complemented write inputs by a first write control transistor controlled by a first write control line; and
    the SHE layer of the second SOT MTJ element coupled in the second configuration across the complemented write inputs by a second write control transistor controlled by a second write control line.

3. The CAM circuit of claim 2, comprising:
    a control circuit configured to write data into the first SOT MTJ element by at least enabling the first write control transistor to establish a first current through the SHE layer of the first SOT MTJ element that alters a magnetization state of the first SOT MTJ element in accordance with the data; and
    the control circuit configured to write data into the second SOT MTJ element by at least enabling the second write control transistor to establish a second current through the SHE layer of the second SOT MTJ element that alters a magnetization state of the second SOT MTJ element in accordance with a complemented version of the data.

4. The CAM circuit of claim 1, comprising:
    a pre-charge element coupling the match indicator line to a predetermined voltage according to a pre-charge control signal.

5. The CAM circuit of claim 1, comprising:
    a control circuit configured to pre-charge the match indicator line to a predetermined voltage and disable the first read transistor and second read transistor; and
    after pre-charging the match indicator line, the control circuit configured to evaluate for a data match state among the first SOT MTJ element and second SOT MTJ element by at least enabling the first read transistor and the second read transistor while complemented search data is presented on the first search line and the second search line to responsively output a match result voltage on the match indicator line representative of the data match state.

6. The CAM circuit of claim 5, wherein the match result voltage comprises the predetermined voltage when a match is determined among the search data and data stored in the first SOT MTJ and second SOT MTJ, wherein the match result voltage comprises a voltage level below the predetermined voltage when a mismatch is determined among the search data and data stored in the first SOT MTJ and second SOT MTJ.

7. The CAM circuit of claim 1, comprising:
    a separate write path and read path arrangement, wherein the write path comprises the complemented write inputs coupled to the SHE layer of the first SOT MTJ and the SHE layer of the second SOT MTJ, and wherein the read path comprises the first read transistor controlled by the first search line and the second read transistor controlled by the second search line.

8. The CAM circuit of claim 1, wherein the SHM comprises one of beta ($\beta$)-tungsten and $\beta$-tantalum.

9. The CAM circuit of claim 1, wherein the first search line and the second search line accept ternary state inputs.

* * * * *